(12) United States Patent
Pickerd et al.

(10) Patent No.: US 7,298,206 B2
(45) Date of Patent: Nov. 20, 2007

(54) MULTI-BAND AMPLIFIER FOR TEST AND MEASUREMENT INSTRUMENTS

(75) Inventors: John J. Pickerd, Hillsboro, OR (US); Thomas F. Lenihan, West Linn, OR (US)

(73) Assignee: Tektronix, Inc., Beaverton, OR (US)

( * ) Notice: Subject to any disclaimer, the term of this patent is extended or adjusted under 35 U.S.C. 154(b) by 95 days.

(21) Appl. No.: 11/349,783

(22) Filed: Feb. 7, 2006

(65) Prior Publication Data

US 2006/0244528 A1    Nov. 2, 2006

Related U.S. Application Data

(60) Provisional application No. 60/676,000, filed on Apr. 29, 2005.

(51) Int. Cl.
*H03F 3/68* (2006.01)
(52) U.S. Cl. .................. 330/126; 330/124 R
(58) Field of Classification Search ............. 330/126, 330/124 R, 295, 84
See application file for complete search history.

(56) References Cited

U.S. PATENT DOCUMENTS 3,769,604 A * 10/1973 Atkinson .................. 330/305
4,845,758 A    7/1989 Op de Beek et al.
5,101,171 A * 3/1992 Redmond ............... 330/124 R
5,745,846 A * 4/1998 Myer et al. ................ 455/209
5,892,833 A    4/1999 Maag et al.

FOREIGN PATENT DOCUMENTS

EP    0343906 A2    11/1989

* cited by examiner

*Primary Examiner*—Henry Choe
(74) *Attorney, Agent, or Firm*—William K. Bucher

(57) ABSTRACT

A multiband amplifier for a test and measurement instrument includes a splitter to split an input signal into split signals, amplifiers, and means for combining and digitizing the amplified signals into a digitized signal. Each amplifier is configured to amplify an associated split signal over an amplifier passband. The amplifier passband of at least one amplifier is different from the amplifier passband of another amplifier.

20 Claims, 3 Drawing Sheets

MULTI-BAND AMPLIFIER FOR TEST AND MEASUREMENT INSTRUMENTS

CROSS-REFERENCE TO RELATED APPLICATIONS

This application claims priority under 35 U.S.C. § 119(e) from U.S. Provisional Application Ser. No. 60/676,000, filed on Apr. 29, 2005, the contents of which are herein incorporated by reference in their entirety.

FIELD OF THE INVENTION

This invention relates to test and measurement instruments and, more particularly, to a multi-band amplifier for use in test and measurement instruments.

BACKGROUND

High quality audio amplifier systems have for many years operated with multi-band amplifier configurations. One of the primary reasons for this was that it is difficult to design a single loudspeaker that can adequately cover the entire audio band. Therefore, a different speaker may be used to cover each portion of the audio spectrum. However, other benefits are obtained such as more headroom from the system with smaller wattage power amplifiers for the overall same output than could be obtained from a single large power amplifier. These types of systems sound cleaner at higher power levels because bands of frequencies are isolated from each other in each channel of amplification, resulting in decreased inter-modulation distortions.

Test and measurement instruments suffer similar problems with wideband input signals. For example, in an oscilloscope, one of the difficult aspects of making a wideband pre-amplifier is the need for an attenuator between it and the input signal. The wider the bandwidth, the more difficult it is to maintain good return loss at the input to the scope. As a result, a 50 ohm match is generally not achieved over the desired bandwidth, degrading the quality of the signal.

Accordingly, a need remains for an improved multi-band amplifier for use in test and measurement instruments.

SUMMARY

An embodiment includes a multiband amplifier for a test and measurement instrument including a splitter to split an input signal into split signals, multiple amplifiers, and means for combining and digitizing the amplified signals into a digitized signal. Each amplifier is configured to amplify an associated split signal over an amplifier passband. The amplifier passband of at least one amplifier is different from the amplifier passband of another amplifier.

Another embodiment includes a test and measurement instrument, such as a digital oscilloscope or a digitizer, including a signal input for receiving an input signal, means for displaying a digitized waveform, means for splitting the input signal into split signals, means for amplifying the split signals, and means for combining the amplified split signals into the digitized waveform. Each split signal is amplified over an amplified frequency range, where the amplified frequency range of at least one split signal is different from the amplified frequency range of another split signal.

A further embodiment includes a method of digitizing a signal including dividing the signal into split signals, amplifying each split signal over an associated frequency range into an amplified signal, and combining the amplified signals into a digitized signal. The frequency range associated with at least one split signal is different from the frequency range associated with another split signal.

DETAILED DESCRIPTION

Figure 1:
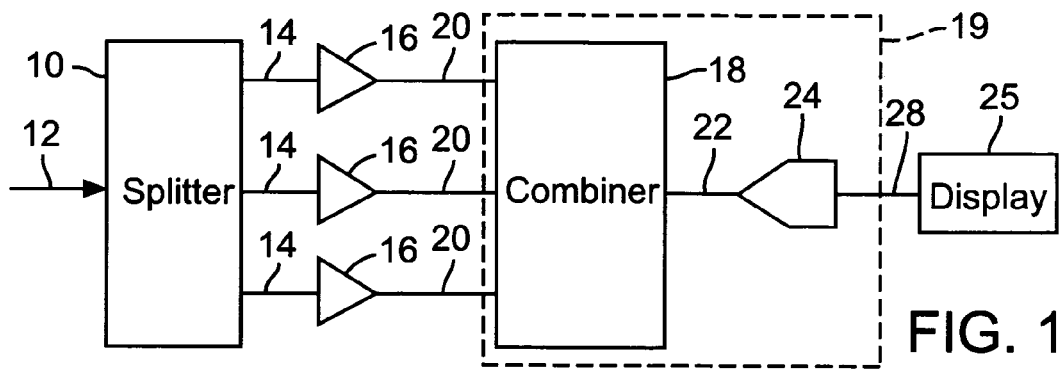
FIG. 1 is a block diagram of a multiband amplifier for a test and measurement instrument.

FIG. 1 is a block diagram of a multiband amplifier for a test and measurement instrument. The multiband amplifier includes a splitter 10, multiple amplifiers 16, means for combining and digitizing 19, and a display 25.

The splitter 10 splits an input signal 12 into multiple split signals 14. The splitter 10 may be a multi-channel power splitter. An example of a multi-channel power splitter is a resistive power splitter or resistive power divider. The resistive power splitter has the advantage of providing a good 50 ohm input impedance over a wide bandwidth at the input of the splitter 10. In addition, because of the inherent power loss of a resistive power splitter, the input and the outputs of the splitter are isolated from each other to some degree. The amount of isolation depends on the number of outputs and a split ratio of the outputs. This isolation reduces the effect of any poor input impedance of any components coupled to the output of the splitter.

Although FIG. 1 shows three split signals 14, the number of split signals 14 from a splitter 12 is not limited to any specific number. The number of split signals 14 may be any integer greater than one.

Furthermore, the amplitudes of the split signals 14 need not be equal. For example, the amplifiers 16 associated with different split signals 14 may have different gains. As a result, the relative attenuation of the split signals 14 may be different to compensate for the difference in gain between the amplifiers 16.

Alternatively, the splitter 10 may be a multi-band cross-over filter. Such a multi-band cross-over filter can direct the energy of the input signal 12 occupying different frequency ranges to different outputs of the splitter. For example, frequencies lower than 10 GHz can be output on a first output of the splitter 10, and frequencies higher than 10 GHz can be output on a second output of the splitter 10. Using such a multi-band cross-over filter has the advantage of limiting the out-of-band signal energy provided to each amplifier 16. As a result of limiting the frequency spectrum input to an amplifier 16, the amplifier 16 will produce less inter-modulation distortion products. Out-of-band frequency components can be attenuated and, consequently, any associated inter-modulation distortion products would be attenuated, improving the quality of the amplified split signal 20.

Each split signal 14 is amplified by an associated amplifier 16 over the passband of the amplifier. The passband of at least one amplifier 16 is different from the passband of another amplifier 16. For example, a first amplifier 16 may amplify frequencies between 0 and 5 GHz. A second amplifier 16 may amplify frequencies between 5 and 10 GHz. A third amplifier may amplify frequencies between 10 and 15 GHz. Thus, the passband of the first amplifier is different from the other two amplifiers. As a result, different frequency components of the input signal 12 are amplified by different amplifiers.

The difficulty of designing an amplifier increases with the desired bandwidth of the amplifier. To cover the frequency range in the example described above, an amplifier with a passband from 0 to 15 GHz would be needed. Such an amplifier is more difficult to design than the 5 GHz bandwidth amplifiers used in the example. Thus, for a given desired bandwidth of the entire system, each amplifier would amplify a portion of that bandwidth. Consequently, the amplifiers needed have bandwidths smaller than the desired system bandwidth.

Amplifying using amplifiers having narrower bandwidths has many advantages over amplifying with one amplifier over a wide bandwidth. Such advantages include more headroom and increased isolation between frequencies. Because a narrower amplifier 16 amplifies a portion of the frequencies of an input signal 12, the amplifier 16 can output higher power signals before the amplifier 16 begins to distort. In addition, frequency isolation is improved because frequencies outside of the amplifier passband are not amplified. This reduces any inter-modulation distortion products on the output signal of the amplifier 16, improving the quality of the signal.

Furthermore, a narrow band amplifier 16 can have higher performance over the bandwidth of the narrow band amplifier 16 as compared to a wide band amplifier. In addition, narrow band amplifiers 16 may be available having passbands beyond the highest frequency range of a wideband amplifier. By aggregating the passbands of the narrow band amplifiers 16, a composite amplifier with a wider passband and higher performance as compared to the wideband amplifier may be obtained.

The means for combining and digitizing 19 combines the amplified signals 20 into a digitized signal 28. One example is shown in FIG. 1. The means for combining and digitizing 19 includes a combiner 18 and a digitizer 24. The combiner 18 combines the amplified signals 20 into a combined signal 22. The digitizer 24 digitizes the combined signal 22 into the digitized signal 28. Similar to the splitter 10, the combiner 18 may be a resistive power combiner.

The combiner 18 may also be a multi-band cross-over filter. Used as a combiner, each amplified split signal 20 is coupled to an associated input that accepts frequencies in a range including the passband of the associated amplifier.

Furthermore, as described with respect to the splitter 10, for the combiner 18, the gain from various inputs to the output can be set as desired. In addition, the gains of the splitter 10 and the combiner 18 may be set in conjunction to achieve a desired gain through a particular path.

The digitizer 24 may include standard circuitry such as a track and hold and A/D converters needed to sample the combined signal 22 and store it in digital memory. The output of the digitizer may optionally be coupled to a display 25.

Figure 2:
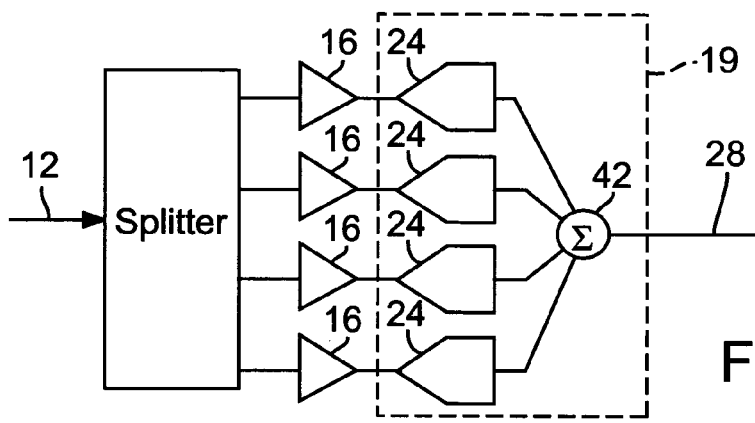
FIG. 2 is a block diagram of a multiband amplifier for a test and measurement instrument with multiple digitizers.

FIG. 2 is a block diagram of a multiband amplifier for a test and measurement instrument with multiple digitizers. The means for combining and digitizing 19 may alternatively include multiple digitizers 24 and a digital combiner 42. Each amplified split signal 20 is digitized by an associated digitizer 24. The digitized signals are then combined with a digital combiner 42. In the example illustrated in FIG. 2, the digital combiner 42 is a digital summing block.

In this example, the sample rates of the digitizers 24 may, but need not be the same. For example, the sample rate of a digitizer 24 used to digitize a 0-5 GHz frequency band may operate at a lower sample rate than a digitizer 24 used to sample a 15-20 GHz frequency band. Furthermore, the sample rates of the digitizers may be less then the final sample rate of the digitized signal 28.

Figure 3:
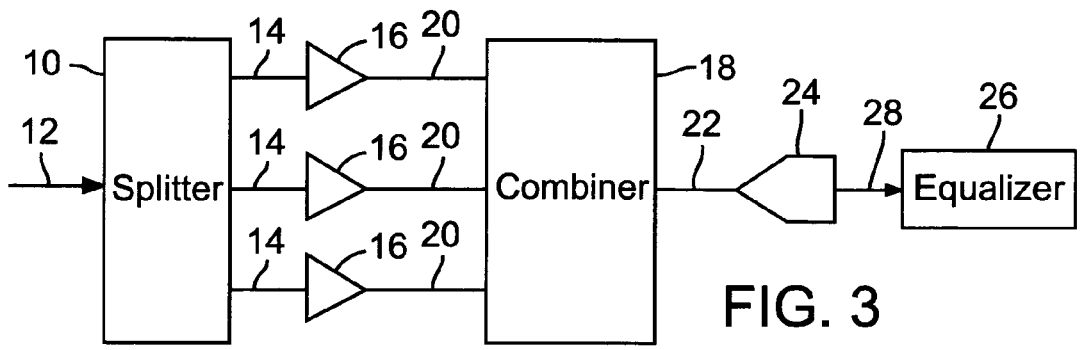
FIG. 3 is a block diagram of an equalized multiband amplifier for a test and measurement instrument.

FIG. 3 is a block diagram of an equalized multiband amplifier for a test and measurement instrument. A multiband amplifier may include an equalizer 26 to equalize the frequency response from an input of the splitter 10 to an input of the equalizer 26. Because components used in the multiband amplifier may not be ideal, the frequency response of the multiband amplifier may not be ideal. The equalizer 26 can correct frequency response problems such as magnitude or phase distortion or both. For example, any overlap in the passbands of the amplifiers 16 may result in amplitude or phase distortion of the input signal 12 when the amplified split signals 20 are combined. Furthermore, the equalizer 26 may compensate for nonlinear distortion. For example, as the output power of an amplifier 16 approaches its 1 dB compression point, the effective gain of the amplifier 16 is reduced. The equalizer 26 may adjust the frequency response in the frequency range amplified by that amplifier 16 in response to the output power in that frequency range. The equalizer 26 may compensate for any such distortion.

Figure 4:
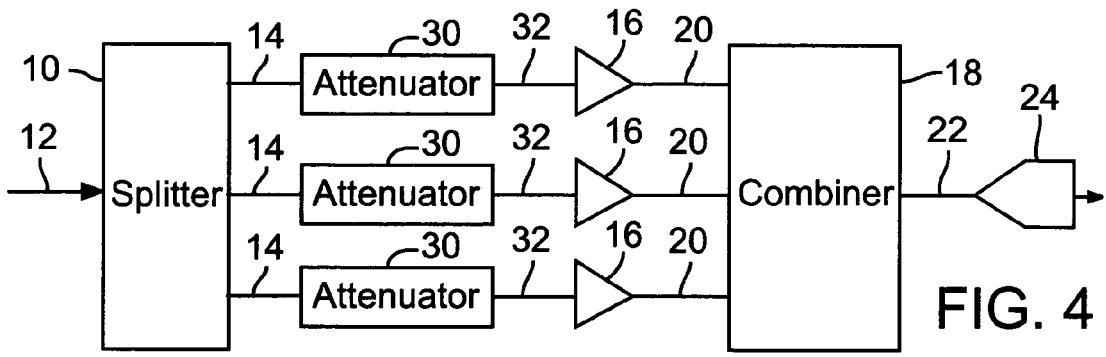
FIG. 4 is a block diagram of a multiband amplifier for a test and measurement instrument with attenuators.

FIG. 4 is a block diagram of a multiband amplifier for a test and measurement instrument with attenuators. Each attenuator may be designed to operate over the frequency range of the associated amplifier 16. The attenuated signal 32 is used as the input to the associated amplifier 16. It is generally less difficult to design a narrowband attenuator than a wideband attenuator. In addition, with evolving MEMS technology, such narrowband attenuators may occupy a relatively small amount of space. Thus, the design of the attenuators may be easier and the space occupied may be reduced.

Figure 5:
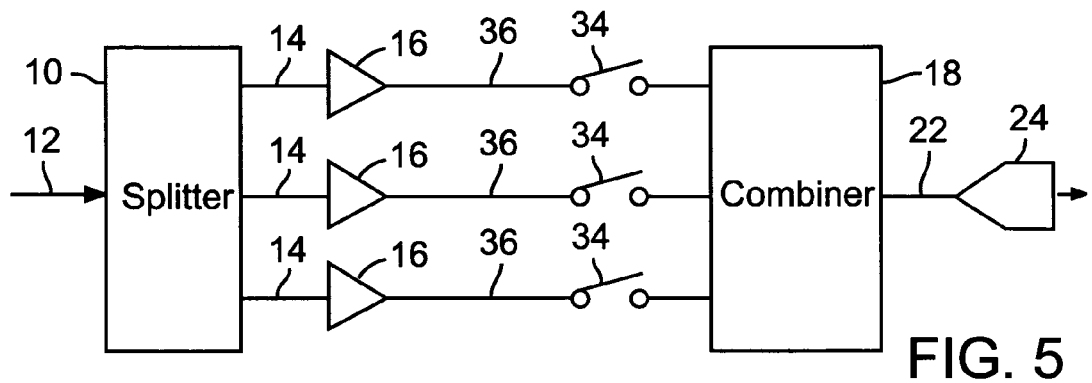
FIG. 5 is a block diagram of a multiband amplifier for a test and measurement instrument with switches.

FIG. 5 is a block diagram of a multiband amplifier for a test and measurement instrument with switches. The multiband amplifier may include switches 34. The switches can selectively control a contribution of an associated amplified signal 20 to the digitized signal 28. In FIG. 5, the switches 34 are illustrated coupled to the outputs of the amplifiers 16. The switches may be part of the amplifiers 16 and may also be part of the combiner 18. Although the term switch has been used, in this context, any device that can control the contribution of an amplified signal to the digitized signal may be termed a switch. For example, a switch may be circuitry that disables the output of an amplifier 16, hence, removing its contribution to the digitized signal.

Furthermore, with reference to FIG. 2, the switches 34 may be implemented digitally. Thus, one or more of the digitized amplified signals may be switched out and not used in the digital combiner 43.

By using such switches 34, user bandwidth choice is possible. The user may choose to not include some bands in the final power recombination. As a result, the digitized signal will include only a subset of the possible frequency bands. Any number of the bands can be selected, including only one. Furthermore, the selection of bands may result in a combined frequency band that is not contiguous. For example, if the bands include four bands, 0-5 GHz, 5-10 GHz, 10-15 GHz, and 15-20 GHz, a user may select the 0-5 GHz, 5-10 GHz, and 15-20 GHz bands, leaving out the 10-15 GHz band.

Such selection allows the user to control the noise introduced by the multiband amplifier. For example, using the frequency bands described above, if a particular input signal 12 has frequency components in the 10-15 GHz and 15-20 GHz frequency bands, the user may select only those bands and not the 0-5 GHz and 5-10 GHz bands. As a result, any noise generated by the amplifiers of the 0-5 GHz and 5-10 GHz bands will not be added to the digitized signal 28.

Figure 6:
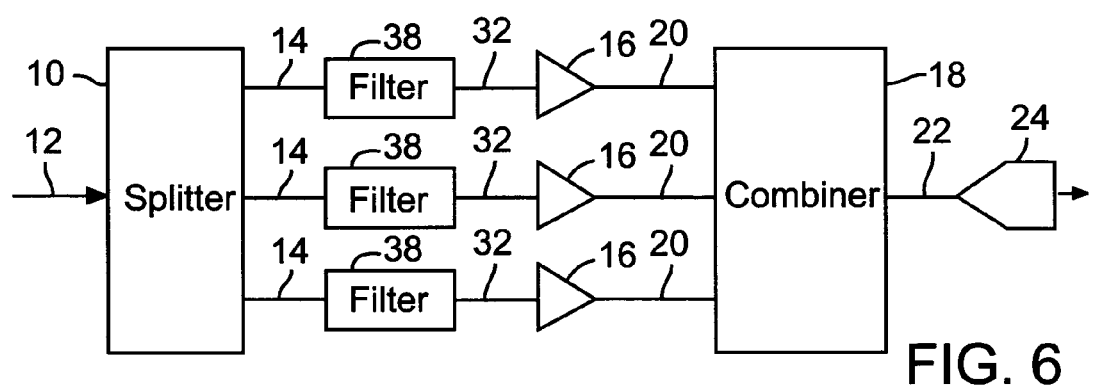
FIG. 6 is a block diagram of a multiband amplifier for a test and measurement instrument with filters.

FIG. 6 is a block diagram of a multiband amplifier for a test and measurement instrument with filters. The multiband amplifier may include multiple filters 38. Each filter 38 filters an associated split signal 14 before the input of an associated amplifier 16. Each filter 38 may have a filter passband substantially equal to the amplifier passband of the associated amplifier 16. As a result, the frequency range of a split signal 14 that is incident on an amplifier 16 may be reduced. Such a reduction can be particularly useful if the splitter 10 is a resistive power divider. By reducing the frequency spectrum input to an amplifier 16, the intermodulation distortion products are reduced, improving the signal quality.

Such a multiband amplifier as described above may be part of a test and measurement instrument. One such type of test and measurement instrument is an oscilloscope platform. The multiband amplifier may also be part of a digitizer platform with the primary goal of converting an analog waveform into a digital waveform represented by binary samples stored in memory for a test and measurement instrument. Furthermore, the multiband amplifier may be part of a probe head or a plug-in module for use with a test and measurement instrument.

An example of such a test and measurement instrument includes a signal input for receiving an input signal, means for splitting the input signal into multiple split signals, means for amplifying the split signals, means for combining the amplified split signals into the digitized waveform, and means for displaying a digitized waveform.

The signal input may be an input to a splitter 10 as described above. Alternatively, the input signal may pass through additional components before entering the splitter 10.

The test and measurement instrument includes means for splitting the input signal into multiple split signals. As described above, the input signal 12 may be split by a splitter 10 such as a resistive power divider or a multi-band crossover filter network. In addition, the means for splitting the input signal may include a filter for each band, as described above. Similarly, the means for splitting the input signal may include an attenuator as described above. The means for splitting the input signal may also include a combination of the above described splitters 10, attenuators 30, and filters 38.

The test and measurement instrument includes means for amplifying the split signals. The means for amplifying amplify each split signal over an amplified passband where the amplified passband of at least one split signal is different from the amplified passband of another of the split signals. The means for amplifying may include amplifiers of similar construction. For example, all of the amplifiers may be lumped element amplifiers. However, the means for amplifying may include amplifiers of different construction. For example, some amplifiers may be lumped element amplifiers, and other amplifiers may be distributed traveling wave amplifiers. In addition, some amplifiers may be formed of discrete components and other amplifiers may be monolithic integrated circuits.

As described above, means for combining the amplified split signals into the digitized waveform may include a combiner and a digitizer, or multiple digitizers and a digital combiner. However, the means for combining may also include a combination of the above described means. For example, multiple amplified split signals may be combined and then digitized into an intermediate digitized signal. Multiple other amplified split signals may be digitized and then combined with the intermediate digitized signal.

The test and measurement instrument includes means for displaying a digitized waveform. Such means may include a video display, memory to store the digitized waveform, or an interface to a display device. For example, a video display may be a CRT display or an LCD display. The interface may include a communications link interface to connect the test and measurement instrument to a computer.

The test and measurement instrument may include means for selecting a subset of the amplified split signals to be combined by the means for combining. For example, the means for selecting may include mechanical switches controlling the outputs of the means for amplifying. The means for selecting may include digitally implemented selection. For example, the means for combining the amplified split signals may digitize the split signals before combining them into the digitized signal. The means for selecting may select only a subset of those signals to be digitally combined, or may multiply a deselected signal by a scaling factor of zero. As a result, only the selected signals are used in the combination.

Figure 7:
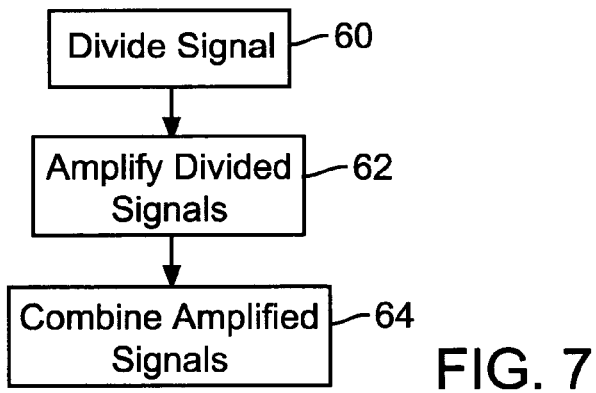
FIG. 7 is a flowchart of a method of digitizing a signal for a test and measurement instrument.

FIG. 7 is a flowchart of a method of digitizing a signal for a test and measurement instrument. The method of digitizing a signal includes dividing the signal into split signals in 60, amplifying each split signal over an associated frequency range into an amplified signal in 62, and combining the amplified signals into a digitized signal in 64. The frequency range associated with at least one split signal is different from the frequency range associated with another split signal.

After dividing the signal in 60, the frequency spectrum of the split signals may be substantially similar. For example, dividing the signal into the split signals using a resistive power splitter may result in split signals having substantially similar frequency spectrums. However, one of ordinary skill in the art will understand that the frequency spectrums of the split signals may not be identical due to non-ideal components. Furthermore, two frequency spectrums are considered substantially similar if the relative amplitudes of frequency components of one frequency spectrum are similar to relative amplitudes of frequency component of the other frequency spectrum. For example, if a resistive power splitter has an uneven split ratio, the absolute amplitudes of the frequency components of the split signals will be different by the split ratios, but the relative amplitudes of the frequency components will be similar.

Alternatively, dividing the signal in 60 may include dividing the signal into split signals that do not all have similar frequency spectrums. The signal may be divided into multiple frequency bands, where each split signal has the frequency components from the signal that occupy one frequency band. The signal may also be divided into split signals where only one split signal has a different frequency spectrum than the other split signals. For example, a signal having frequency components from 0 to 20 GHz may be divided into four split signals, three spanning 0 to 15 GHz, and one spanning 15 to 20 GHz. Furthermore, the frequency bands need not be contiguous. For example, the signal may be divided into two frequency bands, one from 2-8 GHz and another from 12-18 GHz.

Although the division of the signal has been described in reference to the frequency spectrum of the signal, one of ordinary skill in the art will understand that the division need not depend on the frequency components of the signal. For example, the signal, having frequency components between 2 and 3 GHz, may be divided by a multiband crossover filter network, configured to divide a signal into a 0-10 GHz band and a 10-20 GHz band. Because the signal does not have frequency components in the 10-20 GHz range, no frequency components of the signal will appear on that split signal, but the signal will still be split into those bands.

Figure 8:
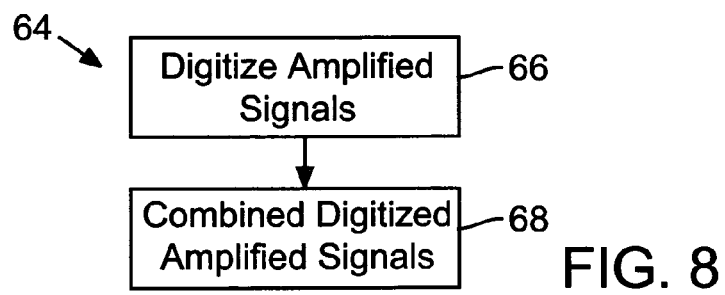
FIG. 8 is a flowchart of combining amplified signals.

Referring to FIG. 8, combining the amplified signals into a digitized signal in 64 may include digitizing each amplified signal into a digitized amplified signal in 66, and digitally combining the digitized amplified signals into the digitized signal in 68. The digitized amplified signals may be combined with similar or varying weights. For example, if similar amplitude amplified signals are digitized into similar amplified digitized signals, similar weights may be used. Alternatively, if there is an imbalance due to the dividing, amplifying, digitizing, etc., the digitized amplified signals may be combined with different weights to compensate for the imbalance.

As described above, the amplified signals may have frequency ranges. As a result, when a particular amplified signal is digitized, it may be digitized at a sample rate different from the sample rates used to digitize the other amplified signals. For example, an amplified signal having frequency components lower than another amplified signal may be digitized at a sample rate lower that the sample rate used to digitize the other amplified signal. As a result, the digitizer for the amplified signal with the lower frequency components may be a lower cost digitizer with a smaller bandwidth.

Figure 9:
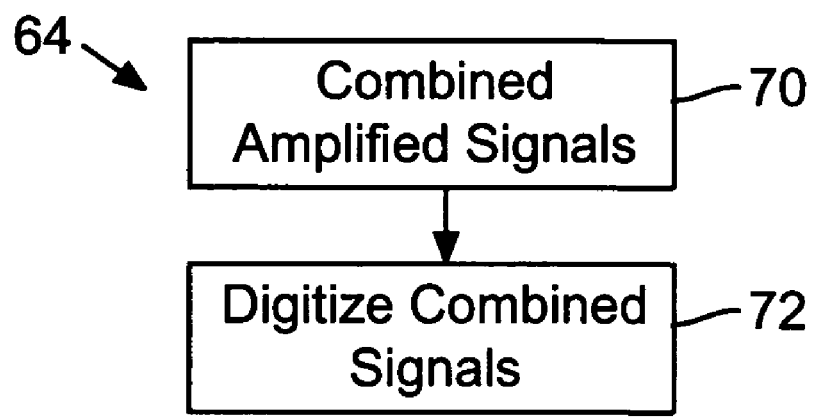
FIG. 9 is another flowchart of combining amplified signals.

Referring to FIG. 9, combining the amplified signals into a digitized signal in 64 may include combining the amplified signals into a combined signal in 70, and digitizing the combined signal into the digitized signal 72.

Figure 10:
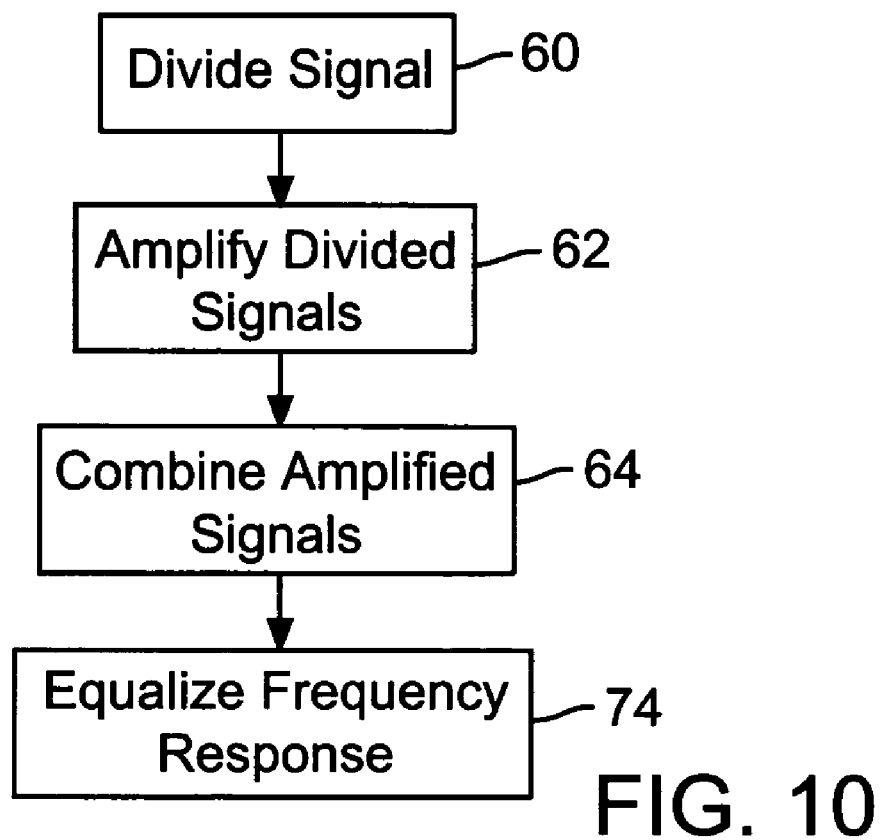
FIG. 10 is a flowchart of a method of digitizing a signal for a test and measurement instrument using frequency response equalization.

Referring to FIG. 10, a frequency response affecting the combined amplified signals may be equalized in 74. The dividing, amplifying, combining, etc., of signals may not be ideal. As a result, the frequency response affecting the combined response may have amplitude or phase distortion. This distortion may be compensated. By equalizing the frequency response from the dividing, amplifying, and combining of signals, a more accurate representation of the input signal may be obtained.

Combining the amplified signals may include combining a subset of the amplified signals into the digitized signal. A subset of the amplified signals may be selected to be used as part of the digitized signal. Any number of the amplified signals may be selected including one to all of the amplified signals. By selecting a subset of amplified signals, other amplified signals are excluded from the combination. As a result, particular frequency ranges of the input signal may be examined without the contribution of unwanted signals or noise from the unselected frequency bands.

In addition, the selection may be through mechanical or digital means. For example, a mechanical switch may mechanically disconnect an amplified signal, removing it from the combination. In addition, a digitized amplified signal may be set to zero before combination, or otherwise not used in the combination. The selection of the bands to be used may be done manually or automatically. For example, a user may change the state of mechanical switches to select the amplified signals of the subset. Alternatively, the user may select the signals from a menu on a test and measurement instrument and the instrument will control the selection of the signals.

A method of digitizing a signal for a test and measurement instrument may include filtering each of the split signals. Each split signal may be filtered over a frequency range. The frequency range of at least one split signal may be different from the frequency range of the other split signals. For example, the range over which the split signal is filtered may match the passband over which the split signal is amplified. However, the passband of a filter need not be limited to the passband over which the split signal is amplified. For example, when amplifying split signals over frequency ranges of 0-5 GHz, 5-10 GHz, and 10-15 GHz, the 0-5 GHz and 5-10 GHz may be filtered with a 0-10 GHz filter, and the 10-15 GHz band may be filtered with a 10-20 GHz filter.

Although particular frequency ranges have been described above, one of ordinary skill in the art will understand that other frequency ranges may be used for reasons such as the bandwidths of the input signals and the availability components. For example, a frequency range of 0 to 20 GHz as been used above to describe an input signal; however, an input signal may have frequency components over a larger or smaller frequency range depending on the signal source. As a result, the number of and frequency ranges of the split signals may be adjusted accordingly. In addition, frequency ranges of bands of the split signals have been described as spanning 5 GHz. However, the frequency range of a split signal may be adjusted to allow for available components. For example, if amplifiers are easily available in octave frequency ranges, the frequency ranges of the split signals may be set to 2-4 GHz, 4-8 GHz, 8-12 GHz, etc.

Although particular embodiments have been described, it will be appreciated that the invention is not limited to those embodiments. Variations and modifications may be made without departing from the scope of the invention as set forth in the following claims.

The invention claimed is:

1. A multiband amplifier for a test and measurement instrument comprising:
   a splitter to split an input signal into a plurality of split signals;
   a plurality of amplifiers, each amplifier operative to amplify an associated split signal over an amplifier passband to produce one or more amplified signals; and
   means for combining and digitizing the amplified signals into a digitized signal;
   wherein the amplifier passband of at least one amplifier is different from the amplifier passband of another amplifier.

2. The multiband amplifier of claim 1, wherein the means for combining and digitizing comprises:
   a combiner to combine the amplified signals into a combined signal; and
   a digitizer to digitize the combined signal into the digitized signal.

3. The multiband amplifier of claim 1, wherein the means for combining and digitizing comprises:

a plurality of digitizers, each digitizer to digitize an associated amplified signal; and a combiner to combine the digitized amplified signals into a the digitized signal.

4. The multiband amplifier of claim 1, further comprising an equalizer to equalize the frequency response from an input of the splitter to an input of the equalizer.

5. The multiband amplifier of claim 1, further comprising a plurality of attenuators, each attenuator coupled to an associated one of the plurality of amplifiers and operative to attenuate an associated split signal before the input of the associated amplifier and having an attenuator passband substantially equal to the amplifier passband of the associated amplifier.

6. The multiband amplifier of claim 1, further comprising a plurality of switches, each switch coupled to an associated one of the plurality of amplifiers and operative to selectively control a contribution of an associated amplified signal to the digitized signal.

7. The multiband amplifier of claim 1, further comprising a plurality of filters, each filter coupled to an associated one of the plurality of amplifiers and operative to filter an associated split signal before the input of an associated amplifier, and having a filter passband substantially equal to the amplifier passband of the associated amplifier.

8. The multiband amplifier of claim 1, wherein the splitter comprises one selected from the group consisting of a resistive power splitter and a multiband crossover filter network.

9. The multiband amplifier of claim 1, wherein the means for combining and digitizing comprises one selected from the group consisting of a resistive power combiner and a multiband crossover filter network.

10. A method of digitizing a signal for a test and measurement instrument comprising:

dividing the signal into a plurality of split signals;

amplifying each split signal over an associated amplifier passband into an amplified signal; and combining the amplified signals into a digitized signal;

wherein the amplifier passband associated with at least one split signal is different from the amplifier passband associated with another split signal.

11. The method of claim 10, wherein combining the amplified signals further comprises:

digitizing each amplified signal into a digitized amplified signal; and digitally combining the digitized amplified signals into the digitized signal.

12. The method of claim 10, wherein combining the amplified signals further comprises:

combining the amplified signals into a combined signal; and digitizing the combined signal into the digitized signal.

13. The method of claim 10, further comprising equalizing a frequency response of an output signal resulting from the dividing, amplifying, and combining of signals.

14. The method of claim 10, wherein dividing the signal comprises dividing the signal into the split signals, the split signals having substantially similar frequency spectrums.

15. The method of claim 10, wherein dividing the signal comprises dividing the signal into the split signals, at least one split signal having a frequency spectrum that does not substantially overlap with a frequency spectrum of another split signal.

16. The method of claim 10, wherein combining the amplified signals comprises combining a subset of less than all of the amplified signals into the digitized signal.

17. The method of claim 10, further comprising filtering each of the split signals, each split signal filtered over a frequency range, the frequency range of at least one split signal different from the frequency range of another split signal.

18. A test and measurement instrument comprising:

a signal input for receiving an input signal;

means for displaying a digitized waveform;

means for splitting the input signal into a plurality of split signals;

means for amplifying the split signals; and means for combining the amplified split signals into the digitized waveform;

wherein each split signal is amplified over a passband of an amplifier to produce amplified split signals, and the amplifier passband of at least one amplifier is different from the amplifier passband of another amplifier.

19. The test and measurement instrument of claim 18, wherein the amplified passband of each split signal is different from every amplified passband of the other split signals.

20. The test and measurement instrument of claim 18, further comprising means for selecting a subset of the amplified split signals to be combined by the means for combining.

* * * * *